(12) United States Patent
Kim

(10) Patent No.: US 8,305,719 B2
(45) Date of Patent: Nov. 6, 2012

(54) ELECTROSTATIC DISCHARGE PROTECTION DEVICE FOR HIGH VOLTAGE OPERATION

(75) Inventor: Kil Ho Kim, Icheon-si (KR)

(73) Assignee: Bauabtech (KR)

( * ) Notice: Subject to any disclaimer, the term of this patent is extended or adjusted under 35 U.S.C. 154(b) by 189 days.

(21) Appl. No.: 12/839,477

(22) Filed: Jul. 20, 2010

(65) Prior Publication Data

US 2011/0013325 A1    Jan. 20, 2011

(30) Foreign Application Priority Data

Jul. 20, 2009    (KR) ......................... 10-2009-0065666

(51) Int. Cl.
*H02H 3/22*    (2006.01)
(52) U.S. Cl. .......................................... 361/56; 361/111

(58) Field of Classification Search .................... 361/56, 361/111
See application file for complete search history.

(56) References Cited

U.S. PATENT DOCUMENTS 5,751,525 A  *  5/1998  Olney ............................. 361/56
2005/0264964 A1 * 12/2005 Coronel et al. ................ 361/56
2008/0259511 A1 * 10/2008 Worley ........................... 361/56

* cited by examiner

*Primary Examiner* — Danny Nguyen
(74) *Attorney, Agent, or Firm* — Schmeiser, Olsen & Watts, LLP

(57) ABSTRACT

Disclosed is an improved electrostatic discharge protection device that can effectively cope with electrostatic stress of a microchip operating at high voltage. The ESD protection device includes at least one gate coupled NMOS (GCNMOS) having a gate connected to a drain via a capacitor disposed between the gate and the drain and connected to a source and a well to pick-up via a resistor, and devices for low or medium voltage operation of 6V or less connected in series to the gate coupled NMOS (GCNMOS).

2 Claims, 15 Drawing Sheets

ELECTROSTATIC DISCHARGE PROTECTION DEVICE FOR HIGH VOLTAGE OPERATION

FIELD OF THE TECHNOLOGY

The present invention relates to semiconductor devices and, more particularly, to an improved electrostatic discharge protection device capable of operating at high voltage.

BACKGROUND

In general, semiconductor devices include an electrostatic discharge (ESD) protection circuit between a pad and a core circuit to protect the core circuit. The electrostatic discharge protection circuit prevents chip failure that is likely to occur when static electricity caused by contact between an external pin of a microchip and a charged human body or machine is discharged to a core circuit or when accumulated static electricity flows to the core circuit. In fabrication of microchips, it is an essential aspect of chip design to design a circuit for protecting a microchip from ESD stress.

A device for use in the protection circuit against the ESD stress is referred to as an ESD protection device.

FIG. 1a is a graphical representation depicting fundamental conditions for an electrostatic discharge protection device, and FIG. 1b is a graphical representation depicting an optimal condition for the ESD protection device.

The ESD protection device has to prevent current flow therethrough upon application of a voltage less than or equal to an operating voltage Vop to the ESD protection device during normal operation of a microchip adopting the ESD protection device. In order to satisfy this requirement, the avalanche voltage Vav and the triggering voltage Vtr of the ESD protection device must be greater than the operating voltage of the microchip during normal operation of the microchip (Vav, Vtr>Vop).

The ESD protection device must be able to provide sufficient protection to a core circuit in the microchip when the microchip is subjected to electrostatic discharge stress. In other words, when an ESD current flows to the microchip, it must be discharged to the outside through the ESD protection device before flowing to the core circuit. To satisfy this requirement, the triggering voltage Vtr of the ESD protection device must be sufficiently lower than the core circuit breakdown voltage Vccb of the microchip under the circumstance that ESD stress is generated in the microchip (Vtr<Vccb).

Generally, an efficient ESD protection device generally exhibits a resistance snapback characteristic wherein on-state resistance of the ESD protection device is reduced after the device is triggered. Such a resistance snapback characteristic is exhibited as a voltage snapback phenomenon wherein the corresponding voltage is lowered, despite an increase in current flowing through the ESD protection device. Here, if the snapback phenomenon becomes too severe, the ESD protection device suffers a latch-up phenomenon which allows excess current to flow through the ESD protection device, thereby causing thermal breakdown of the microchip, even in the case where the microchip is normally operated. The ESD protection device must be prevented from abnormal operation resulting from the latch-up phenomenon. To satisfy this requirement, the snapback holding voltage Vh of the ESD protection device must be greater than the operating voltage of the microchip by a sufficient safety margin (Vh>Vop+$^\Delta$V). Otherwise, the triggering current Itr must be sufficiently greater than a certain value (Itr>~100 mA).

The ESD protection device generally adopts a multi-finger structure wherein devices having a constant size are arranged in parallel to each other for efficient use of a layout area. When such a multi-finger structure is adopted, it is necessary for the respective fingers of the ESD protection device to operate uniformly. In other words, the respective fingers of the ESD protection device cooperate to discharge an injected electrostatic discharge current to the outside. To this end, other fingers must also be triggered to cooperatively discharge the ESD current before a certain finger is triggered and suffers thermal breakdown. To satisfy this requirement, the thermal breakdown voltage Vtb of the ESD protection device must be greater than or at least similar to the triggering voltage (Vtr≦Vtb) thereof.

For normal operation of a microchip, these four conditions must be satisfied. Further, when an ESD current flows to the microchip, it is necessary for the ESD protection device to start to operate as rapidly as possible at as low a voltage as possible.

On the other hand, one fundamental characteristic for semiconductor devices operating at high voltage is that the avalanche voltage must be higher than the operating voltage. To satisfy this requirement, the semiconductor device employs, as a basic element, an N-type MOSFET having a double diffused drain, that is, a double diffused drain N-type MOSFET (DDDNMOS), as shown in FIG. 2. In order to construct the DDDNMOS structure, double impurity implantation for forming a drain is performed as shown in FIG. 2. In the DDDNMOS structure, a drain activation area 111 is formed by implanting an impurity at a sufficiently high density of $10^{15}$~$10^{16}$ cm$^{-3}$, and a drain drift area 112 is formed outside the drain activation area 111 by implanting an impurity at a relatively low density of about $10^{13}$ cm$^{-3}$. In most cases, a source activation area 120 has the same impurity density as the drain activation area 111 since they are formed at the same time by the impurity implantation. A P-well 100 forming a channel is formed by implanting a P-type impurity at a density of about $10^{12}$ cm$^{-3}$, which is lower than the drain drift area 112. Generally, the avalanche voltage tends to increase as two adjoining areas having electrically opposite polarities decrease in impurity densities. Hence, since the DDDNMOS structure enables sufficient reduction of the impurity density for the drain drift area 112 which adjoins the P-well 100, it is possible to achieve a desired high avalanche voltage.

In order to use the DDDNMOS operating at high voltage as the ESD protection device, a gate 130, a source 120 and a well-pick up 140 are bundled and grounded on a circuit, with only the drain connected to a power terminal or an individual input/output terminal, thereby forming a grounded gate DDDNMOS (GGDDDNMOS), as shown in FIG. 2. With this electrode structure, the GGDDDNMOS does not allow an electric current to flow therethrough when a voltage applied to the drain is lower than the avalanche voltage. On the other hand, when the voltage applied to the drain increases above the avalanche voltage, impact ionization occurs at an interface between the P-well and the drain drift area to create a number of carriers, so that a parasitic NPN bipolar transistor is formed, causing a large amount of electric current to flow between the drain and the source. With this electrode structure, the GGDDDNMOS does not allow an electric current to flow therethrough at a voltage less than the avalanche voltage while allowing the current to flow therethrough at a voltage more than the avalanche voltage, thereby satisfying the fundamental characteristics for use as the ESD protection device which protects a core circuit by coping with undesired stress current during electrostatic discharge. To increase ESD stress current treatment capabilities, a multi-finger GGDDDNMOS is provided by connecting several single-finger GGDDDN-MOS devices in parallel to each other.

Here, when a parasitic NPN bipolar transistor (BJT) is created in the GGDDDNMOS to allow a large amount of current to start to flow therethrough, a very low resistive current path is formed to connect the drain/channel/source areas to each other along the surface of the device, causing the current to concentrate on the device surface. Such concentration of the current on the device surface causes deterioration in capability of the GGDDDNMOS to cope with ESD stress current. In particular, since the current path has very low resistance, the thermal breakdown voltage of the GGDDDN-MOS becomes lower than the triggering voltage of the BJT, thereby making it difficult to realize stable multi-finger triggering. In this way, when the current path is restrictively formed along the surface of the device to cause concentration of the current only on the device surface, a surface temperature of the device sharply rises even at low current, thereby causing the thermal breakdown phenomenon on the surface of the device. As a result, the capability of the device to cope with the ESD stress current is significantly deteriorated.

FIG. 3 is a graphical representation depicting typical voltage-current characteristics of a GGDDDNMOS device operating as an ESD protection device.

In view of a design window of the ESD protection device, the GGDDDNMOS cannot be used as the ESD protection device due to the following two problems.

Firstly, the GGDDDNMOS is not sufficiently strong against ESD stress current. In other words, the GGDDDN-MOS cannot cope with a large amount of electrostatic current. Secondly, the thermal breakdown voltage of the GGD-DDNMOS is lower than the triggering to voltage of the BJT (Vtr≧Vtb). As a result, the respective fingers of the multi-finger structure do not operate uniformly.

Therefore, to ensure effective coping with ESD stress of a microchip operating at high voltage, there is a need for an ESD protection device that can solve the problems of the GGDDDNMOS while exhibiting high avalanche voltage characteristics.

SUMMARY

The present invention is conceived to solve the above problems, and an aspect of the invention is to provide an improved electrostatic discharge protection device that can effectively cope with electrostatic stress of a microchip operating at high voltage.

In accordance with an aspect of the invention, there is provided an electrostatic discharge protection device including: at least one gate coupled NMOS (GCNMOS) having a gate connected to a drain via a capacitor disposed between the gate and the drain and connected to a source and a well pick-up via a resistor; and devices for low or medium voltage operation of 6V or less connected in series to the gate coupled NMOS (GCNMOS).

The devices for low or medium voltage operation may be selected from gate grounded NMOS (GGNMOS), gate grounded PMOS (GGPMOS) and diodes.

The kind and number of devices for low or medium voltage operation may be selected to satisfy the following equation.

$$Vtr(Op) > Vop, Vtr(ESD) < Vccb, Vh(Tot) < Vop + ^\Delta V, V(2A,Tot) < Vccb,$$

where Vtr(Op) is an overall triggering voltage during normal operation, Vtr(ESD) is an overall triggering voltage upon inflow of electrostatic current, Vh(Tot) is an overall snapback holding voltage, and V(2 A,Tot) is an overall operating voltage upon inflow of a current of 2 A.

BRIEF DESCRIPTION OF THE DRAWINGS

The above and other aspects, features and advantages of the invention will become apparent from the following detailed description in conjunction with the accompanying drawings, in which.

DETAILED DESCRIPTION

Exemplary embodiments of the invention will now be described in detail with reference to the accompanying drawings. It should be understood that the embodiments may take different forms and are not intended to limit the scope of the present invention.

Prior to description of an electrostatic discharge protection device for high voltage operation according to embodiments of the present invention, electrical characteristics of typical MOSFET and diodes will be described. Herein, the term "typical" means MOSFET devices and diodes that are operated at a low voltage (≦1.8 V) or a medium voltage (2.5~6.0 V) in a microchip.

FIGS. 4a, 4b, 5a, 5b, 6a and 6b are circuit diagrams and current characteristics of GGNMOS, GGPMOS and diode, respectively.

Figure 4A:
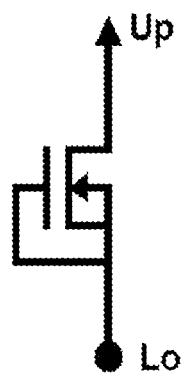
FIG. 4a is a circuit diagram of a GGNMOS device and FIG. 4b is a graphical representation depicting current characteristics of the GGNMOS device.
Figure 4B:
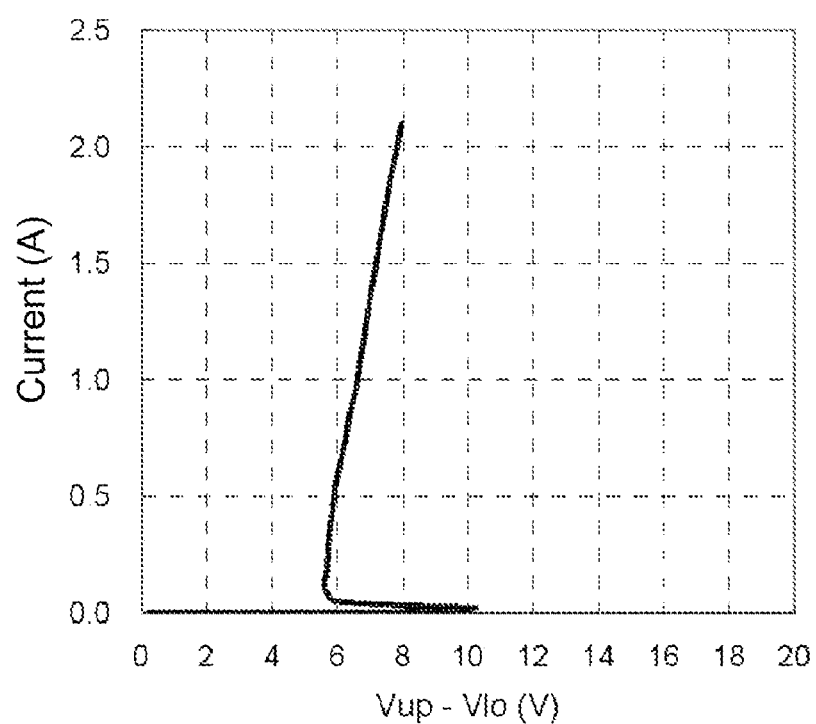
Figure 5A:
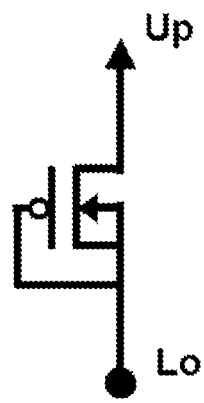
FIG. 5a is a circuit diagram of a GGPMOS device and FIG. 5b is a graphical representation depicting current characteristics of the GGPMOS device.
Figure 5B:
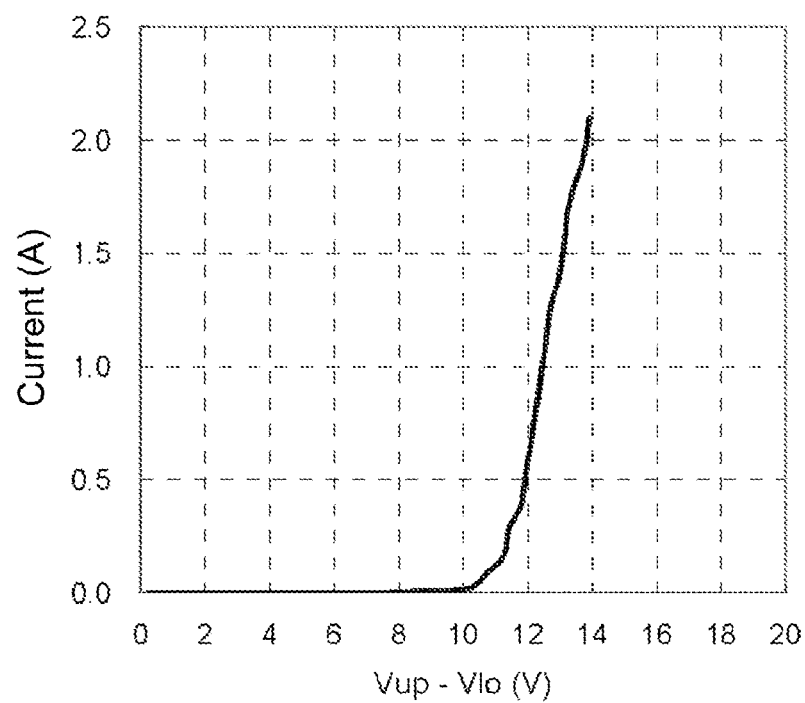
Figure 6A:
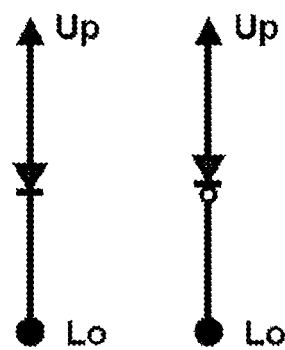
FIG. 6a is a circuit diagram of a diode and FIG. 6b is a graphical representation depicting current characteristics of the diode.
Figure 6B:
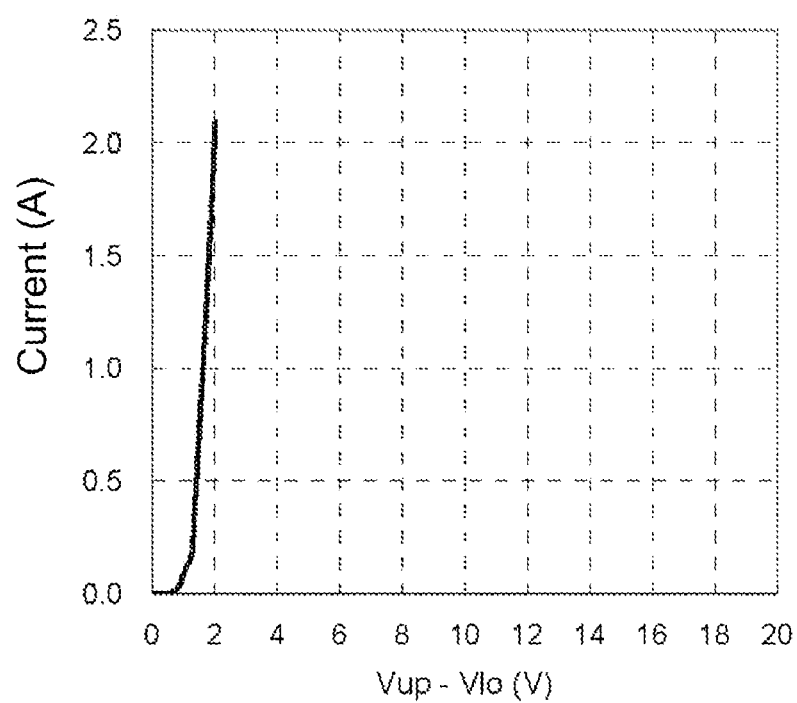

In general, the MOSFET and the diode for low or medium voltage operation exhibit very stable electrical characteristics, as shown in FIGS. 4b, 5b, and 6b. In other words, the MOSFET and the diode have the stable capability to cope with electrostatic current and especially a considerably large amount of electrostatic current introduced thereinto.

Referring to FIGS. 4a and 4b, in the GGNMOS, an NPN bipolar transistor (BJT) is triggered to operate at a considerably high voltage and then undergoes a considerably strong snapback phenomenon, that is, a decrease in voltage when an electric current flowing through the device increases. Referring to FIGS. 5a and 5b, in the GGPMOS, a PNP bipolar transistor (BJT) is triggered to operate at a voltage substantially similar to that of the GGNMOS, but exhibits no snapback characteristics.

Referring to FIGS. 6a and 6b, the diode is triggered at a very low voltage during forward operation, allows a very small increase in voltage according to the amount of electric current, and exhibits no snapback characteristics.

Figure 1A:
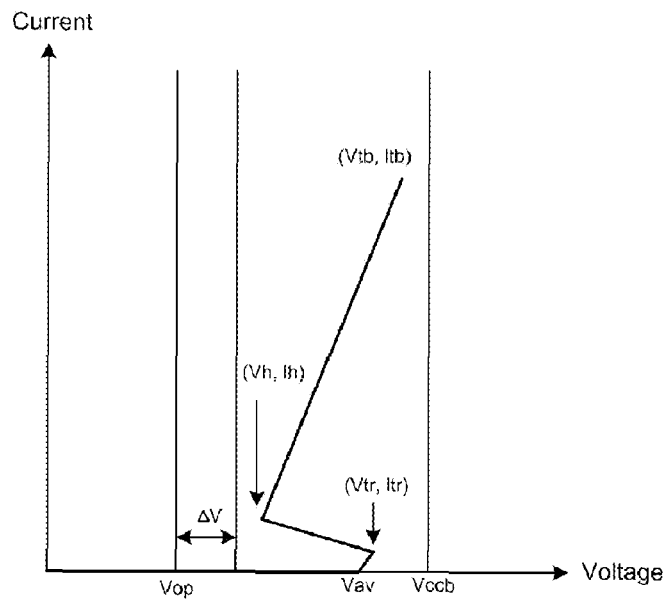
FIG. 1a is a graphical representation depicting fundamental conditions for an electrostatic discharge protection device.
Figure 1B:
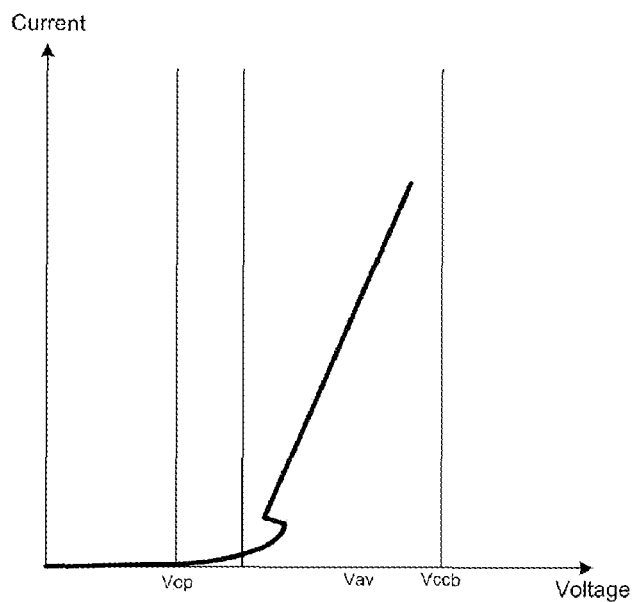
FIG. 1b is a graphical representation depicting an optimal condition for the ESD protection device.
Figure 2:
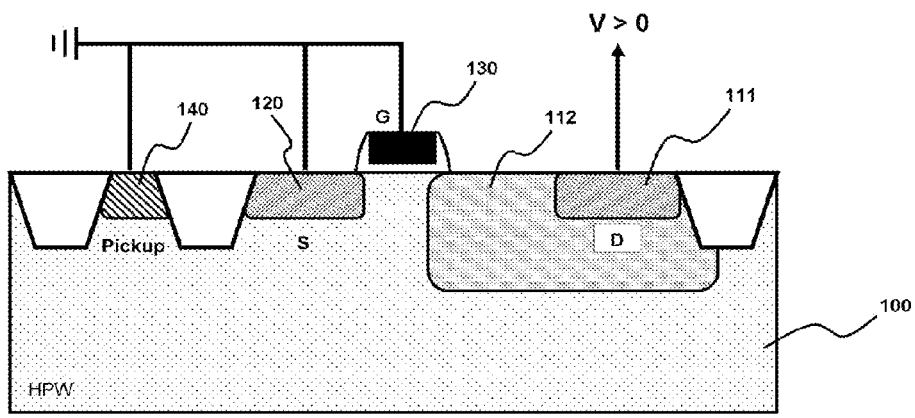
FIG. 2 is a sectional view of a high voltage MOSFET, showing electrode connection of the MOSFET when used as an electrostatic discharge protection device.
Figure 3:
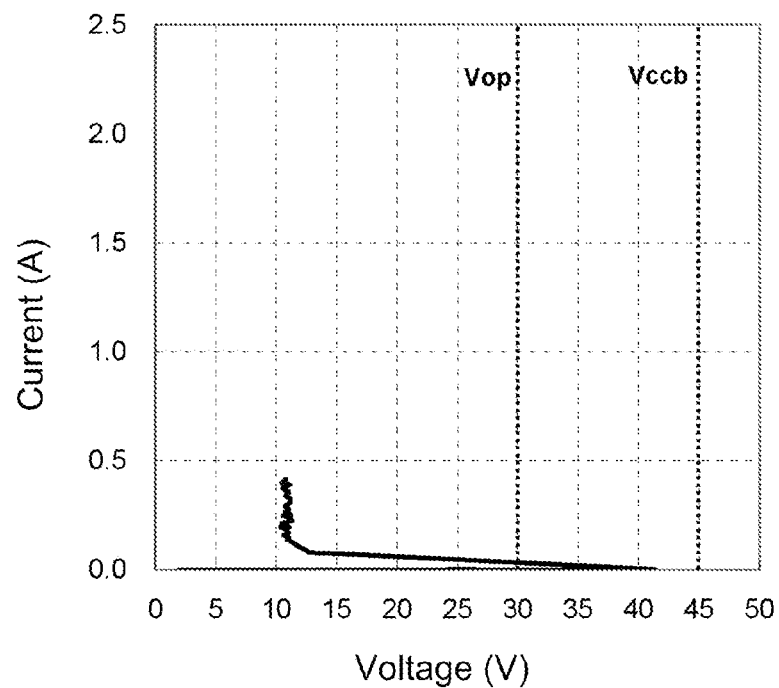
FIG. 3 is a graphical representation depicting typical voltage-current characteristics of a GGDDDNMOS device operating as an ESD protection device.

The GGNMOS device for coping with the electrostatic current satisfies the fundamental conditions shown in FIG. 1a, but does not meet the optimal condition shown in FIG. 1b. Accordingly, in order for the GGNMOS device to satisfy optimal conditions for the ESD protection device, a method of coupling a gate of the GGNMOS device is proposed. That is, the gate of the GGNMOS device is connected to a drain via a capacitor and to a source and a well pick-up via a resistor instead of binding the gate of a MOSFET with the source and the well pick-up. Such a device formed by changing the connection of the gate is referred to as gate coupled N-type MOSFET (GCNMOS).

Figure 7A:
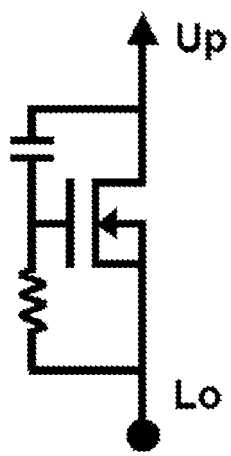
FIG. 7a is a circuit diagram of a GCNMOS device.
Figure 7B:
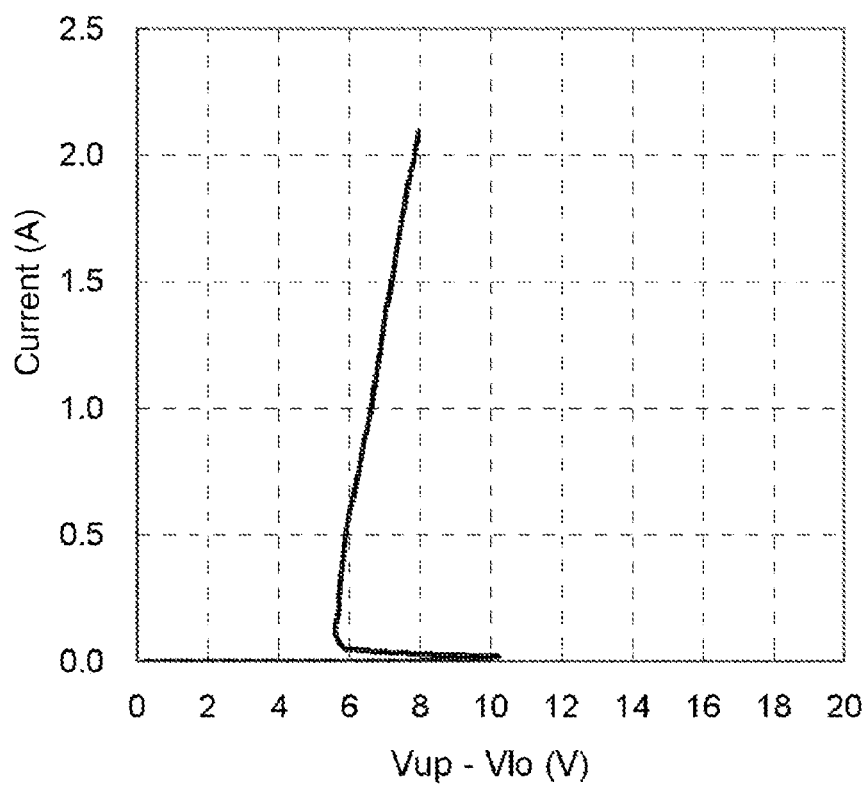
FIG. 7b is a graphical representation depicting current characteristics of the GCNMOS device during normal operation.
Figure 7C:
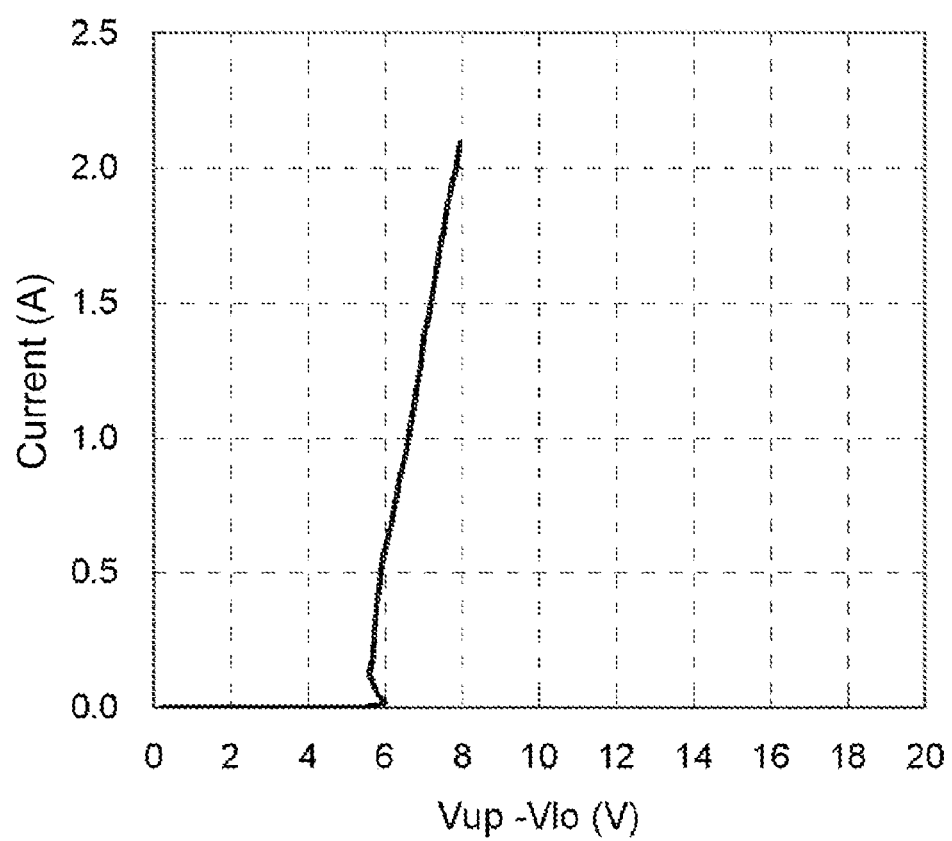
FIG. 7c is a graphical representation depicting current characteristics of the GCNMOS device upon inflow of electrostatic current.

FIG. 7a is a circuit diagram of a GCNMOS device, FIG. 7b is a graphical representation depicting current characteristics of the GCNMOS device during normal operation, and FIG. 7c is a graphical representation depicting current characteristics of the GCNMOS device upon inflow of electrostatic current.

The GCNMOS may be formed to exhibit the same electrical characteristics as those of the GGNMOS in normal operation of a semiconductor chip while being triggered at low voltage upon inflow of electrostatic current by suitably adjusting the strength of gate coupling, that is, the capacitor and the resistor to which the gate is coupled. In other words, an optimal electrostatic discharge protection device may be embodied using the GCNMOS.

Generally, the absolute values of device parameters, such as triggering voltage Vtr, snapback holding voltage Vh, thermal breakdown voltage Vtb, and the like, are changed according to processes. The following exemplary absolute values of device parameters are values that are generally obtained by medium voltage MOSFETs and diodes.

|  | GGNMOS | GGPMOS | Diode | GCNMOS (normal) | GCNMOS (inflow of electrostatic current) |
|---|---|---|---|---|---|
| Vtr | 10.2 V | 10.2 V | 0.8 V | 10.2 V | 6.0 V |
| Vh | 5.6 V | 11.2 V | 1.2 V | 5.6 V | 5.6 V |
| V(2A) | 7.8 V | 13.8 V | 2.0 V | 7.8 V | 7.8 V |

Figure 8:
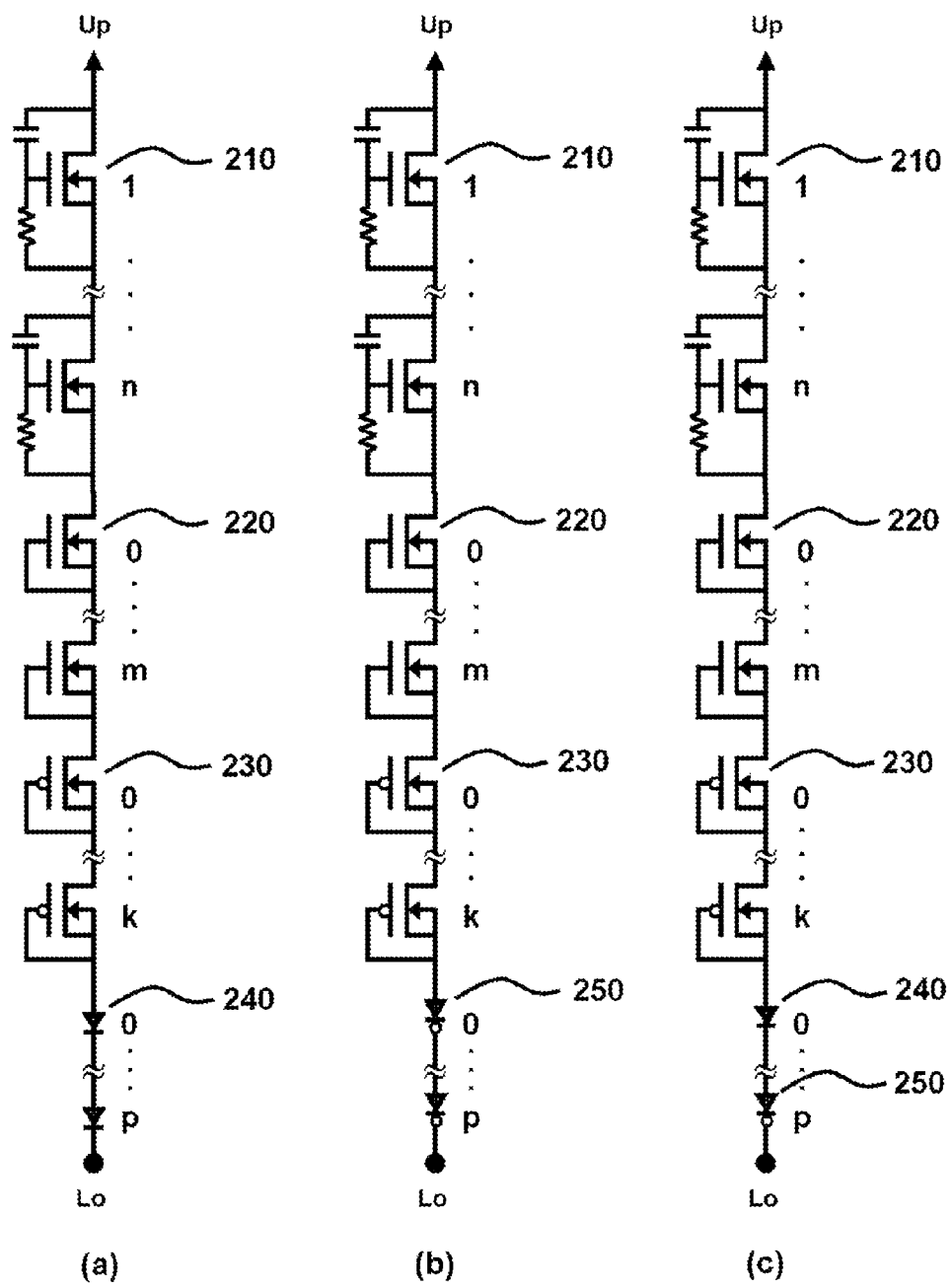
FIGS. 8 and 9 are exemplary circuit diagrams of an electrostatic discharge protection device for high voltage operation that is realized by serially connecting electrostatic discharge protection devices for low or medium voltage operation.
Figure 9:
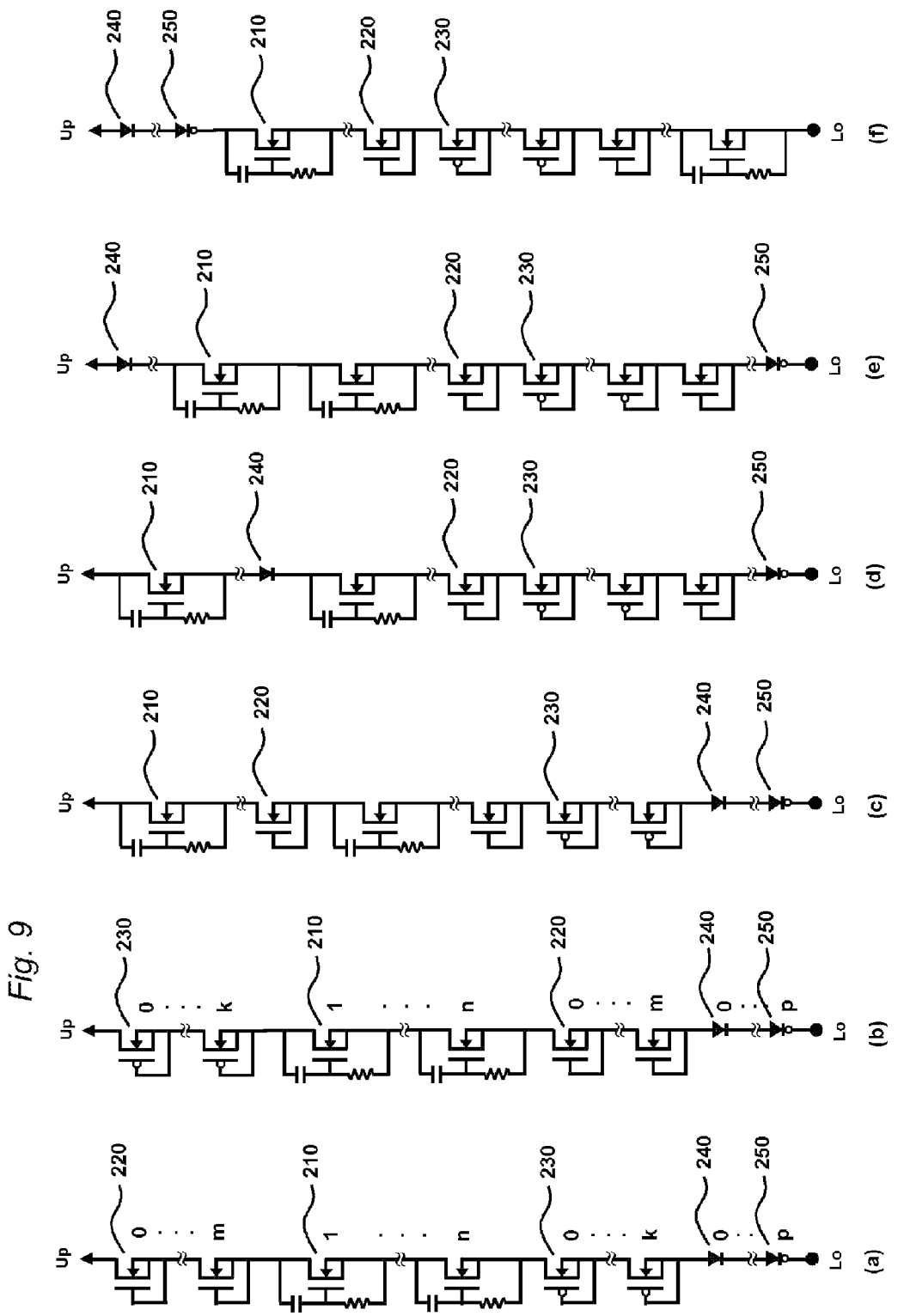

To solve the problems of a conventional electrostatic discharge protection device for high voltage operation, one aspect of the invention provides an electrostatic discharge protection device for high voltage operation that is embodied by serially connecting low voltage/medium voltage electrostatic discharge protection devices. FIGS. 8 and 9 illustrate examples of the electrostatic discharge protection device according to the invention.

FIGS. 8 and 9 are exemplary circuit diagrams of an electrostatic discharge protection device for high voltage operation that is realized by serially connecting electrostatic discharge protection devices for low or medium voltage operation.

Referring to FIGS. 8 and 9, a suitable number of electrostatic discharge protection devices for low or medium voltage operation, that is, GCNMOS 210, GGNMOS 220, GGPMOS 230, and diodes 240 and 250, are selected in consideration of operating voltages of the respective devices and connected in series to one another. In selecting the kind and number of devices to be connected in series to one another, the electrostatic discharge protection device for high voltage operation includes at least one GCNMOS 210 and the other kinds of devices may be suitably selected according to circumstances. Since the electrostatic discharge protection device for high voltage operation includes at least one GCNMOS, it is possible to lower the triggering voltage of the overall device upon inflow of electrostatic current.

An overall triggering voltage Vtr(Op) during normal operation, an overall triggering voltage Vtr(ESD) upon inflow of electrostatic current, an overall snapback holding voltage Vh(Tot), and an overall operating voltage V(2 A,Tot) upon inflow of a current of 2 A are calculated by the following equations.

$$Vtr(Op)=n \times Vtr(GCN)+m \times Vtr(GGN)+k \times Vtr(GGP)+p \times Vtr(Dio)$$

$$Vtr(ESD)=n \times Vtr(GCN)+m \times Vtr(GGN)+k \times Vtr(GGP)+p \times Vtr(Dio)$$

$$Vh(\text{Tot})=n \times Vh(GCN)+m \times Vh(GGN)+k \times Vh(GGP)+p \times Vh(Dio)$$

$$V(2\,\text{A,Tot})=n \times V(2A,GCN)+m \times V(2A,GGN)+k \times Vh(2A,GGP)+p \times Vh(2A,Dio)$$

Here, "n" indicates the number of GCNMOSs for use in serial connection, "m" indicates the number of GGNMOSs for use in serial connection, "k" indicates the number of GGPMOSs for use in serial connection, and "p" indicates the number of diodes for use in serial connection. Further, Vtr (GCN) indicates a triggering voltage of the GCNMOS, Vh(GCN) indicates a snapback holding voltage of the GCNMOS, and V(2 A, GCN) indicates an operating voltage when a current of 2 A flows through the GCNMOS. Vtr(GGN) indicates a triggering voltage of the GGNMOS, Vh(GGN) indicates a snapback holding voltage of the GGNMOS, and V(2 A, GGN) indicates an operating voltage when a current of 2 A flows through the GGNMOS. Vtr(GGP) indicates a triggering voltage of the GGPMOS, Vh(GGP) indicates a snapback holding voltage of the GGPMOS, and V(2 A, GGP) indicates an operating voltage when a current of 2 A flows through the GGPMOS. Vtr(Dio) indicates a triggering voltage of the diode, Vh(Dio) indicates a snapback holding voltage of the diode, and V(2 A, Dio) indicates an operating voltage when a current of 2 A flows through the diode.

On the other hand, the kind and number of devices for low or medium voltage operation may be selected to satisfy conditions in Equation 1:

$$Vtr(Op)>Vop, Vtr(ESD)<Vccb, Vh(\text{Tot})<Vop+\Delta V, V(2\,\text{A,Tot})<Vccb \quad (1)$$

where Vtr(Op) is an overall triggering voltage during normal operation, Vtr(ESD) is an overall triggering voltage upon inflow of electrostatic current, Vh(Tot) is an overall snapback holding voltage, and V(2 A,Tot) is an overall operating voltage upon inflow of a current of 2 A.

Considering the conditions of FIGS. 1a and 1b, the conditions of Equation 1 may be fundamental conditions for an electrostatic discharge protection device at a certain operating voltage and a certain breakdown voltage of a core circuit. The optimal conditions for the electrostatic discharge protection device may be satisfied by lowering the triggering voltage using the at least one GCNMOS only upon inflow of electrostatic current while satisfying the conditions of Equation 1. Particularly, the reason for setting 2 A as a reference current in the condition of V(2 A,Tot)<Vccb is that a device must endure up to 2 A in order to pass ESD Human Body Model 2,000V, which is the most common standard for coping with electrostatic stress. However, when a standard of the reliability test relating to static electricity of a microchip is changed, the reference current may also be changed accordingly.

Except for the condition that at least one GCNMOS is included in the ESD protection device, there is no restriction relating to the number of "n", "m", "k" and "p". Further, there is no restriction relating to the sequence of serially connecting individual devices. In other words, as shown in FIGS. 8 and 9, the ESD protection device according to the invention may be realized by various combinations of devices connected in various sequences. Further, it is possible to change on-state resistance in a predetermined range by changing the sizes of the electrostatic discharge protection devices, that is, GCN-MOSs, GGNMOSs, GGPMOSs, and diodes, which will participate in serial connection. Hence, it is possible to always satisfy the conditions of Equation 1 at a certain high operating voltage by suitably adjusting the number and sizes of the electrostatic discharge protection devices, that is, GCN-MOSs, GGNMOSs, GGPMOSs, and diodes.

Figure 10A:
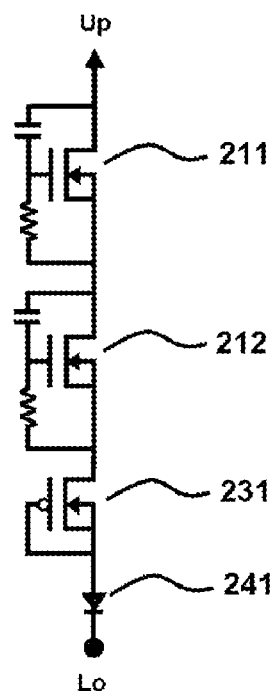
FIGS. 10a, 11a and 12a are circuit diagrams of electrostatic discharge protection devices in accordance with embodiments of the present invention.
Figure 11A:
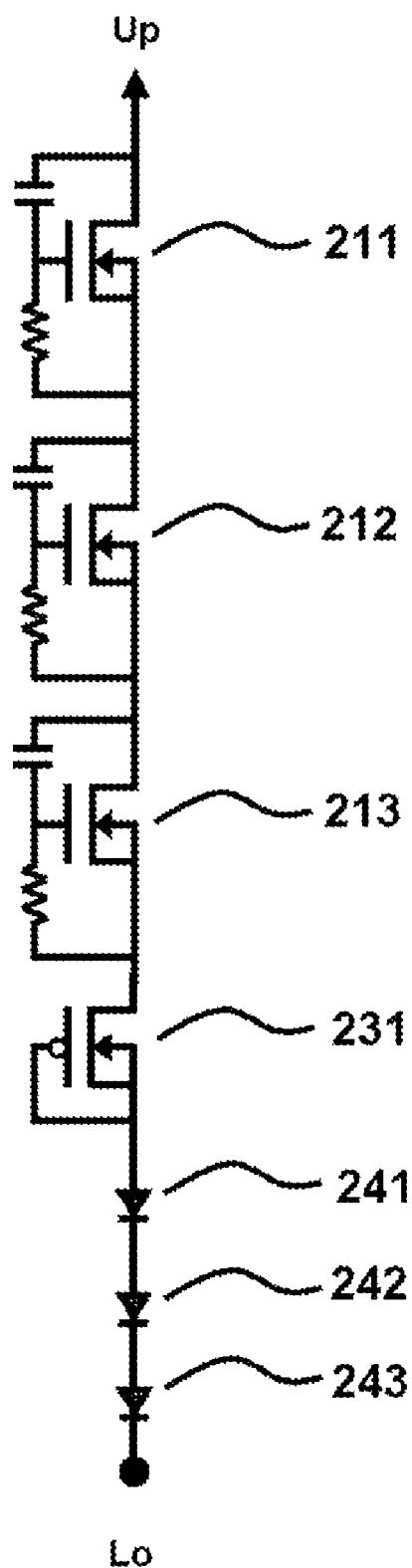
Figure 12A:
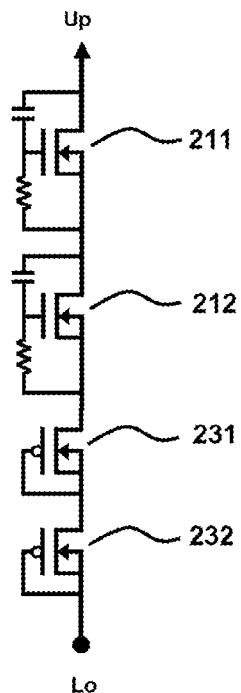

FIGS. 10a, 11a and 12a illustrate electrostatic discharge protection devices for high voltage operation according to exemplary embodiments, which are embodied using the devices shown in FIGS. 4a, 5a, 6a and 7a. These embodiments are optimized for an operating voltage of 20V and a core circuit breakdown voltage of 35V.

Figure 10B:
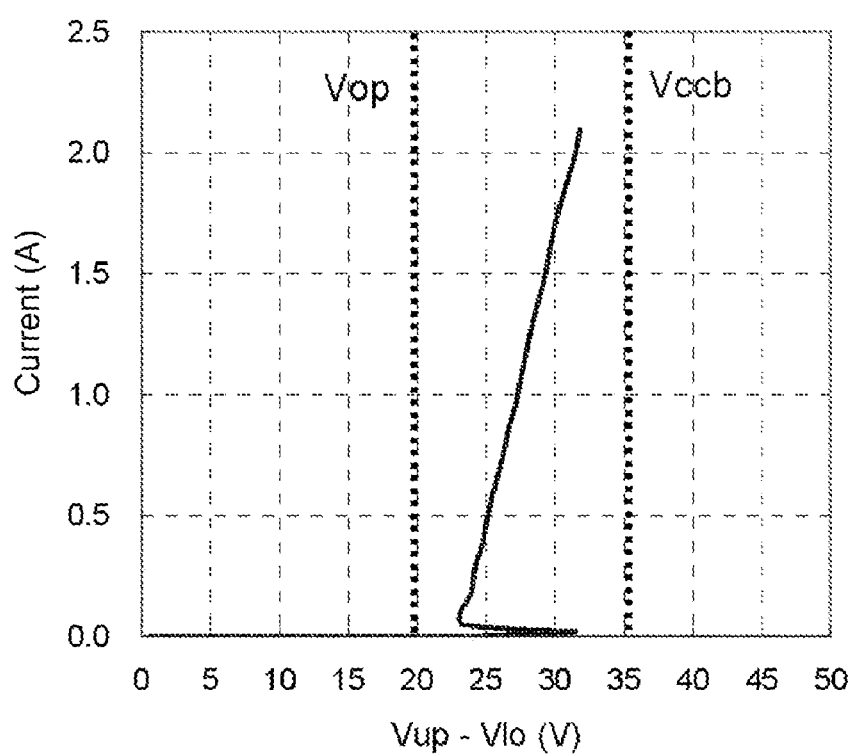
FIGS. 10b, 11b and 12b are graphical representations depicting current characteristics of the devices during normal operation.
Figure 10C:
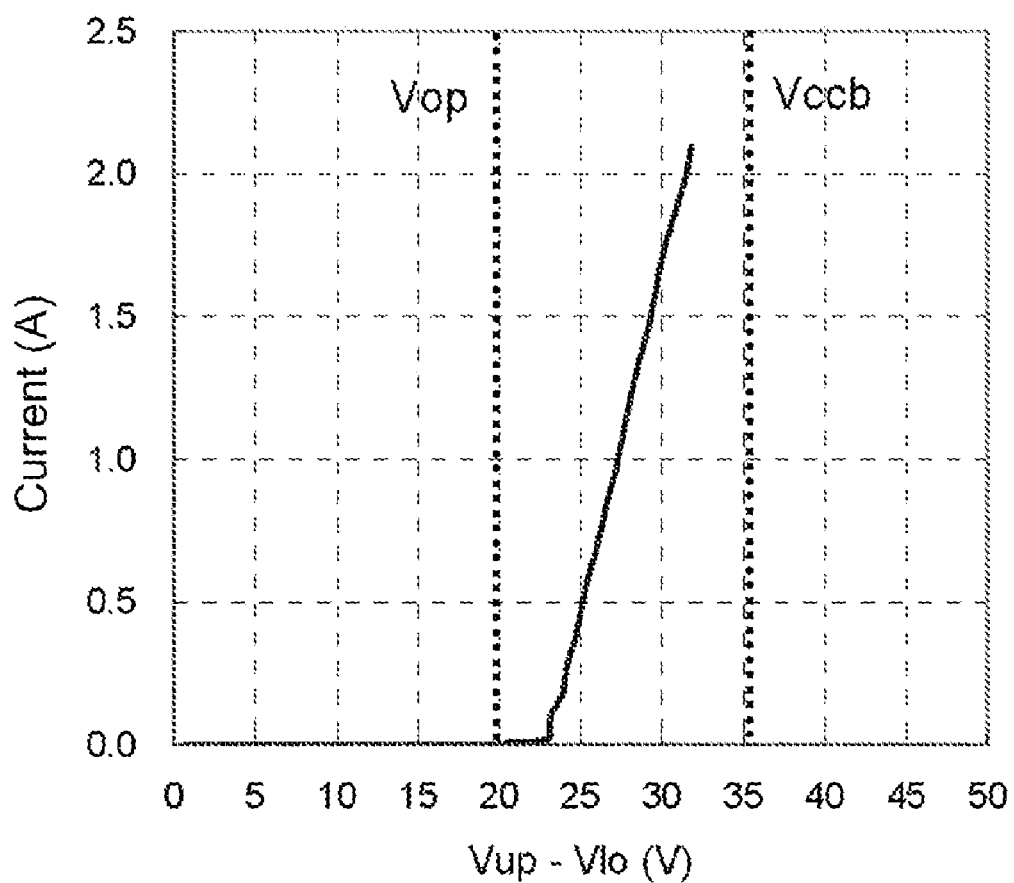
FIGS. 10c, 11c and 12c are graphical representations depicting current characteristics of the devices upon inflow of electrostatic current.

First, FIG. 10a is a circuit diagram of an optimized electrostatic discharge protection device formed by serially connecting two GCNMOSs 211 and 212, a single GGPMOS 231 and a single diode 241 to one another, FIG. 10b is a graphical representation depicting current characteristics of the ESD protection device during normal operation, and FIG. 10c is a graphical representation depicting current characteristics of the ESD protection device upon inflow of electrostatic current.

In this combination, the characteristic parameters of Equation 1, that is, the overall triggering voltage Vtr(Op) during normal operation, the overall triggering voltage Vtr(ESD) upon inflow of electrostatic current, the overall snapback holding voltage Vh(Tot), and the overall operating voltage V(2 A,Tot) upon inflow of a current of 2 A, are calculated as follows (n=2, m=0, k=1, p=1).

$$Vtr(Op)=n\times Vtr(GCN)+m\times Vtr(GGN)+k\times Vtr(GGP)+p\times Vtr(Dio)=2\times 10.2+0\times 10.2+1\times 10.2+1\times 0.8=31.4V>20V$$

$$Vtr(ESD)=n\times Vtr(GCN)+m\times Vtr(GGN)+k\times Vtr(GGP)+p\times Vtr(Dio)=2\times 6.0+0\times 10.2+1\times 10.2+1\times 0.8=23.0V<35V$$

$$Vh(Tot)=n\times Vh(GCN)+m\times Vh(GGN)+k\times Vh(GGP)+p\times Vh(Dio)=2\times 5.6+0\times 5.6+1\times 11.2+1\times 1.2=23.6V>20V$$

$$V(2\,A,Tot)=n\times V(2A,GCN)+m\times V(2A,GGN)+k\times Vh(2A,GGP)+p\times Vh(2A,Dio)=2\times 7.8+1\times 7.8+1\times 13.8+1\times 2=31.4V<35V$$

All of these values satisfy the conditions of Equation 1. Accordingly, it can be concluded that the combined device illustrated in FIG. 10a is an electrostatic discharge protection device optimized for an operating voltage of 20V and a core circuit breakdown voltage of 35V.

Figure 11B:
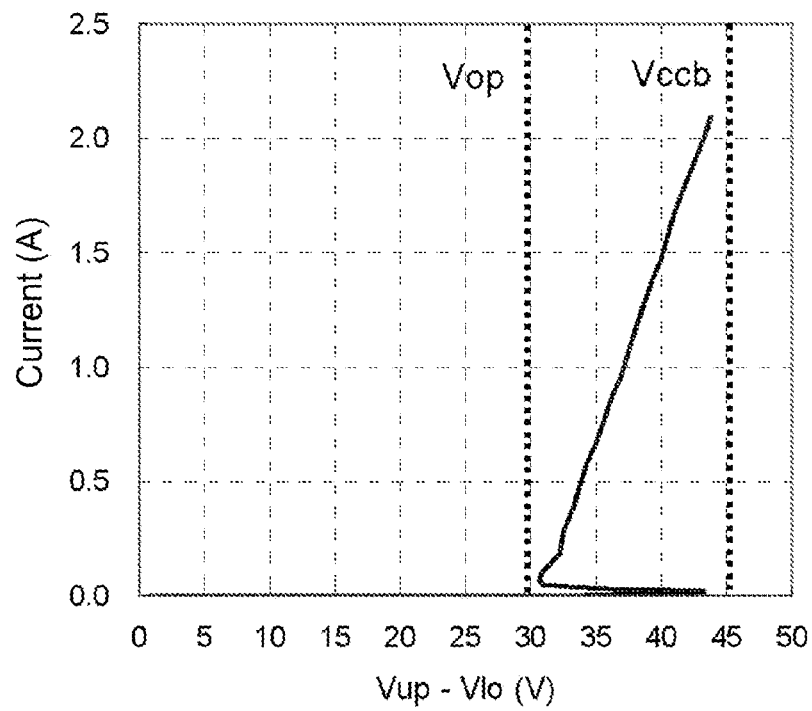
Figure 11C:
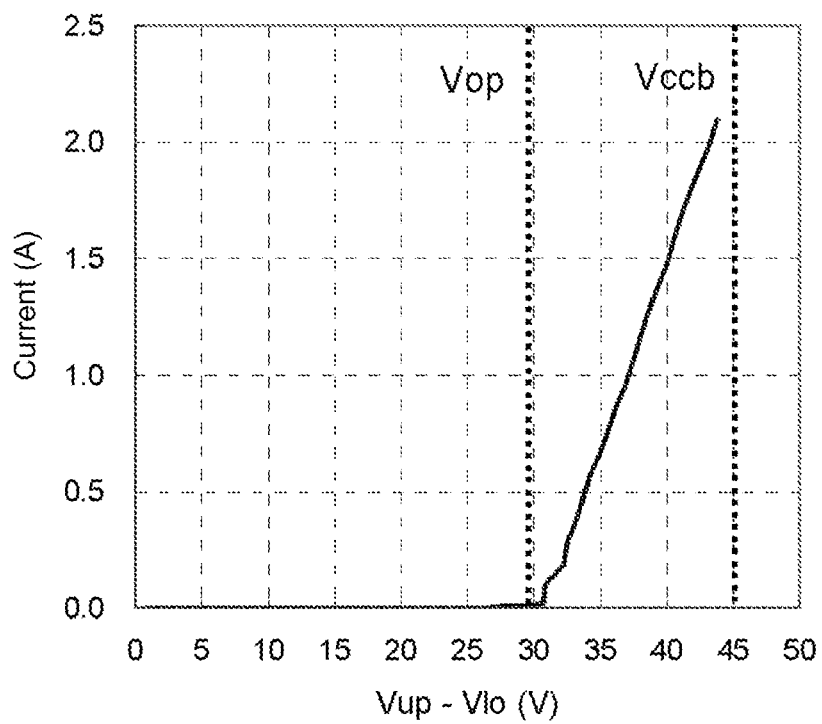

Next, FIG. 11a is a circuit diagram of an optimized electrostatic discharge protection device embodied using the devices shown in FIGS. 4a, 5a, 6a and 7a. This ESD protection device is optimized for an operating voltage of 30V and a core circuit breakdown voltage of 45V, FIG. 11b is a graphical representation depicting current characteristics of this ESD protection device during normal operation, and FIG. 11c is a graphical representation depicting current characteristics of this ESD protection device upon inflow of electrostatic current.

Referring to FIG. 11a, the ESD protection device includes three GCNMOSs 211, 212 and 213, a single GGPMOS 231 and three diodes 241, 242 and 243 connected in series to one another. In this combination, the characteristic parameters of Equation 1, that is, the overall triggering voltage Vtr(Op) during normal operation, the overall triggering voltage Vtr(ESD) upon inflow of electrostatic current, the overall snapback holding voltage Vh(Tot), and the overall operating voltage V(2 A,Tot) upon inflow of a current of 2 A, are calculated as follows (n=3, m=0, k=1, p=3).

$$Vtr(Op)=n\times Vtr(GCN)+m\times Vtr(GGN)+k\times Vtr(GGP)+p\times Vtr(Dio)=3\times 10.2+0\times 10.2+1\times 10.2+3\times 0.8=43.2V>30V$$

$$Vtr(ESD)=n\times Vtr(GCN)+m\times Vtr(GGN)+k\times Vtr(GGP)+p\times Vtr(Dio)=3\times 6.0+0\times 10.2+1\times 10.2+3\times 0.8=29.0V<45V$$

$$Vh(Tot)=n\times Vh(GCN)+m\times Vh(GGN)+k\times Vh(GGP)+p\times Vh(Dio)=3\times 5.6+0\times 5.6+1\times 11.2+3\times 1.2=31.6V>30V$$

$$V(2\,A,Tot)=n\times V(2A,GCN)+m\times V(2A,GGN)+k\times Vh(2A,GGP)+p\times Vh(2A,Dio)=3\times 7.8+0\times 7.8+1\times 13.8+3\times 2=43.2V<45V$$

All of these values satisfy the conditions of Equation 1. Accordingly, it can be concluded that the combined device illustrated in FIG. 11a is an electrostatic discharge protection device optimized for an operating voltage of 30V and a core circuit breakdown voltage of 45V.

Figure 12B:
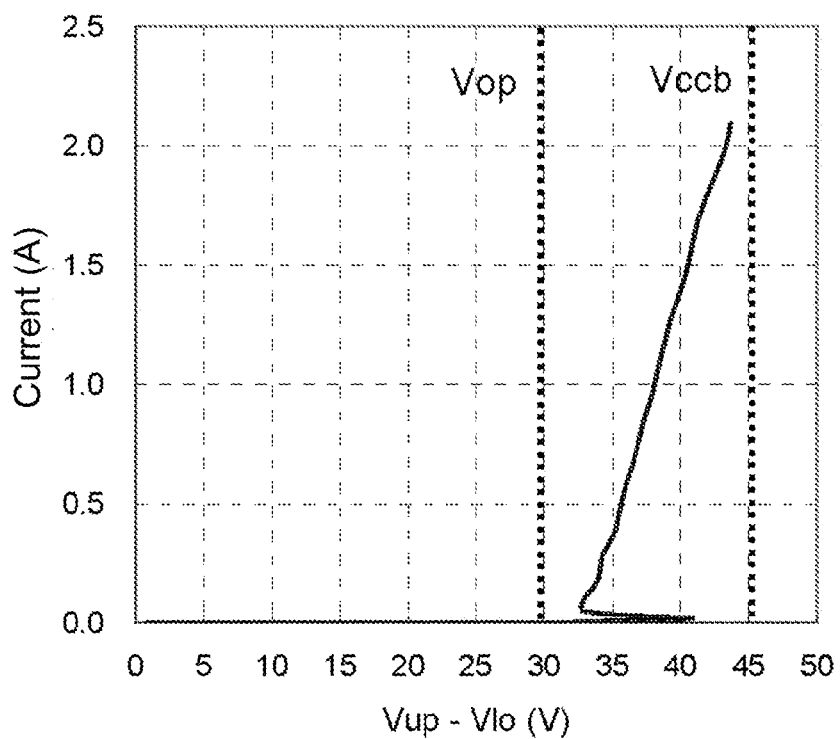
Figure 12C:
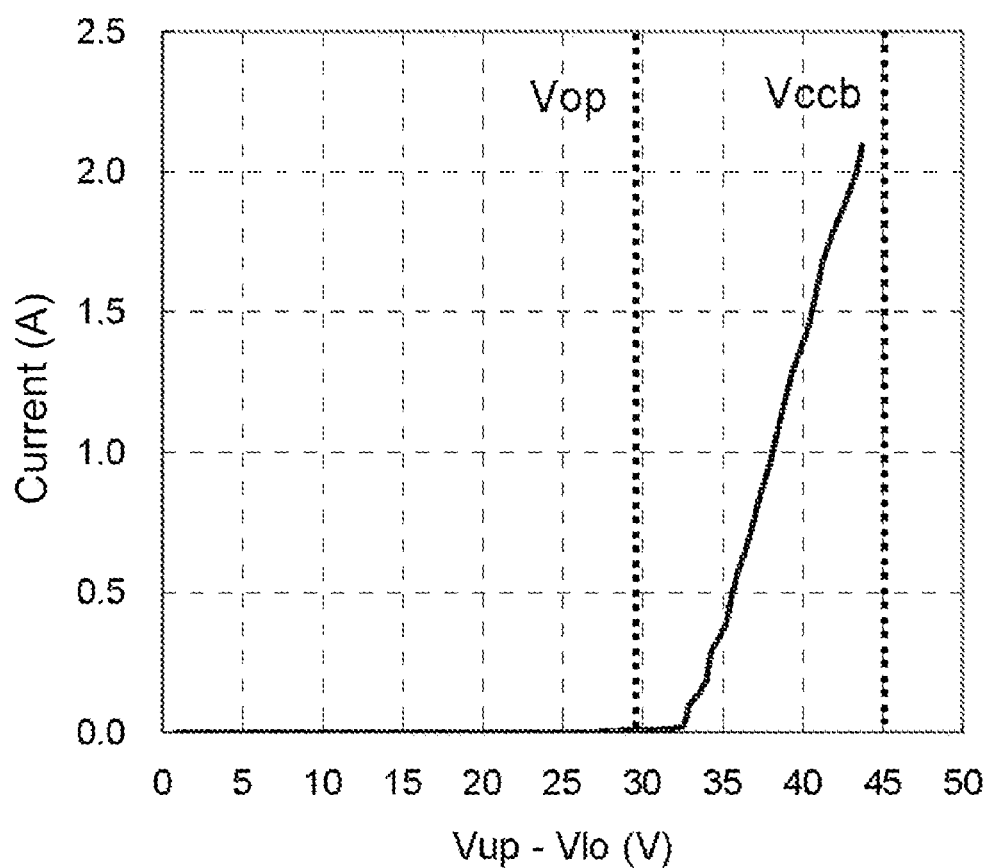

Next, FIG. 12a is a circuit diagram of an optimized electrostatic discharge protection device embodied using the devices shown in FIGS. 4a, 5a, 6a and 7a. This ESD protection device is optimized for an operating voltage of 30V and a core circuit breakdown voltage of 45V, FIG. 12b is a graphical representation depicting current characteristics of this ESD protection device during normal operation, and FIG. 12c is a graphical representation depicting current characteristics of this ESD protection device upon inflow of electrostatic current.

Referring to FIG. 12a, the ESD protection device includes two GCNMOSs 211 and 212 and two GGPMOSs 231 and 232 connected in series to one another. In this combination, the characteristic parameters of Equation 1, that is, the overall triggering voltage Vtr(Op) during normal operation, the overall triggering voltage Vtr(ESD) upon inflow of electrostatic current, the overall snapback holding voltage Vh(Tot), and the overall operating voltage V(2 A,Tot) upon inflow of a current of 2 A, are calculated as follows (n=2, m=0, k=2, p=0).

$$Vtr(Op)=n\times Vtr(GCN)+m\times Vtr(GGN)+k\times Vtr(GGP)+p\times Vtr(Dio)=2\times 10.2+0\times 10.2+2\times 10.2+0\times 0.8=40.8V>30V$$

$$Vtr(ESD)=n \times Vtr(GCN)+m \times Vtr(GGN)+k \times Vtr(GGP)+ \\ p \times Vtr(Dio)=2 \times 6.0+0 \times 10.2+2 \times 10.2+0 \times \\ 0.8=32.4V<45V$$

$$Vh(\text{Tot})=n \times Vh(GCN)+m \times Vh(GGN)+k \times Vh(GGP)+p \times \\ Vh(Dio)=2 \times 5.6+0 \times 5.6+2 \times 11.2+0 \times \\ 1.2=33.6V>30V$$

$$V(2\,A,\text{Tot})=n \times V(2A,GCN)+m \times V(2A,GGN)+k \times Vh(2A, \\ GGP)+p \times Vh(2A,Dio)=2 \times 7.8+0 \times 7.8+2 \times 13.8+0 \times \\ 2=43.2V<45V$$

All of these values satisfy the conditions of Equation 1. Accordingly, it can be concluded that the combined device illustrated in FIG. 12a is also an electrostatic discharge protection device optimized for an operating voltage of 30V and a core circuit breakdown voltage of 45V.

As apparent from above description, according to the embodiments, the ESD protection device includes at least one GCNMOS device and a suitable number and kind of individual electrostatic discharge protection devices for low/medium voltage operation connected in series to one another, thereby enabling effective operation at high voltage.

Although some embodiments have been provided to illustrate the invention in conjunction with the drawings, it will be apparent to those skilled in the art that the embodiments are given by way of illustration only, and that various modifications, changes, alterations, and equivalent embodiments can be made without departing from the spirit and scope of the invention. The scope of the invention should be limited only by the accompanying claims.

What is claimed is:

1. An electrostatic discharge (ESD) protection device comprising:
   at least one gate coupled NMOS (GCNMOS) having a gate connected to a drain via a capacitor disposed between the gate and the drain and connected to a source and a well pick-up via a resistor; and
   a plurality of devices for low or medium voltage operation of 6V or less connected in series to the gate coupled NMOS (GCNMOS);
   wherein the plurality of devices for low or medium voltage operation are at least one of gate grounded NMOS (GGNMOS) devices, gate grounded PMOS (GGPMOS) devices, and diodes;
   wherein a kind and a number of the plurality of devices for low or medium voltage operation is selected to satisfy the following equation:

$$Vtr(Op)>Vop, Vtr(ESD)<Vccb, Vh(\text{Tot})<Vop+\Delta V, V(2\,A,\text{Tot})<Vccb,$$

where $Vtr(Op)$ is an overall triggering voltage during normal operation, $Vtr(ESD)$ is an overall triggering voltage upon inflow of electrostatic current, $Vh(\text{Tot})$ is an overall snapback holding voltage, and $V(2\,A,\text{Tot})$ is an overall operating voltage upon inflow of a current of 2 A.

2. An electrostatic discharge (ESD) protection device comprising:
   a plurality of series connected unit devices, each unit device comprising at least one gate coupled NMOS (GCNMOS) having a gate connected to its own drain via a capacitor disposed between the gate and the drain and connected to its own source and its own well pick-up via a resistor; and devices for low or medium voltage operation of 6V or less connected in series to the gate coupled NMOS (GCNMOS);
   wherein the unit devices are selected to satisfy the following equation:

$$Vtr(Op)>Vop, Vtr(ESD)<Vccb, Vh(\text{Tot})<Vop+\Delta V, V(2\,A,\text{Tot})<Vccb,$$

where Vtr(Op) is an overall triggering voltage during normal operation, Vtr(ESD) is an overall triggering voltage upon inflow of electrostatic current, Vh(Tot) is an overall snapback holding voltage, and V(2 A,Tot) is an overall operating voltage upon inflow of a current of 2 A;
   wherein said each device is selected from gate grounded NMOS (GGNMOS) devices, gate grounded PMOS (GGPMOS) devices, and diodes.

* * * * *